United States Patent [19]

Showman et al.

[11] 4,349,238
[45] Sep. 14, 1982

[54] INTEGRATED CIRCUIT PACKAGE CONNECTOR

[75] Inventors: Robert L. Showman, Hershey; Patrick F. Yeager, Middletown, both of Pa.

[73] Assignee: AMP Incorporated, Harrisburg, Pa.

[21] Appl. No.: 204,122

[22] Filed: Nov. 5, 1980

[51] Int. Cl.³ .......................................... H01R 13/629
[52] U.S. Cl. ............................. 339/75 M; 339/17 CF
[58] Field of Search .......... 339/17 CF, 75 M, 75 MP, 339/75 R, 176 MP

[56] References Cited

U.S. PATENT DOCUMENTS

| | | | |
|---|---|---|---|
| 3,329,926 | 7/1967 | Aksu et al. | 339/75 MP |
| 3,474,387 | 10/1969 | Krum et al. | 339/75 MP |
| 3,753,211 | 8/1973 | Pauza et al. | 339/75 MP |
| 3,846,734 | 11/1974 | Pauza et al. | 339/17 CF |
| 3,883,207 | 5/1975 | Tomkiewicz | 339/75 M |
| 4,080,032 | 3/1978 | Cherian et al. | 339/75 M |
| 4,189,199 | 2/1980 | Grau | 339/75 MP |
| 4,266,840 | 5/1981 | Seidler | 339/75 M |

FOREIGN PATENT DOCUMENTS

| | | | |
|---|---|---|---|
| 1366928 | 9/1974 | United Kingdom | 339/75 MP |
| 2039160 | 7/1980 | United Kingdom | 339/75 M |

Primary Examiner—John McQuade
Attorney, Agent, or Firm—Russell J. Egan

[57] ABSTRACT

A connector is disclosed for mounting integrated circuit packages onto a printed circuit board or the like. The connector has a housing which is mounted on the printed circuit board and secured thereto by the terminals it carries in at least one row of aligned and spaced apart terminals. A terminal actuating insert is mounted in the housing for each row of terminals and positioned to act directly upon the terminals of that row. The connector also includes an actuating retainer or cover member which is applied after the integrated circuit package is placed into the housing. The actuating retainer or cover member acts on the inserts to cause the terminals to be closed about the leads of the integrated circuit package and also rests against the integrated circuit package to secure it in the housing.

10 Claims, 5 Drawing Figures

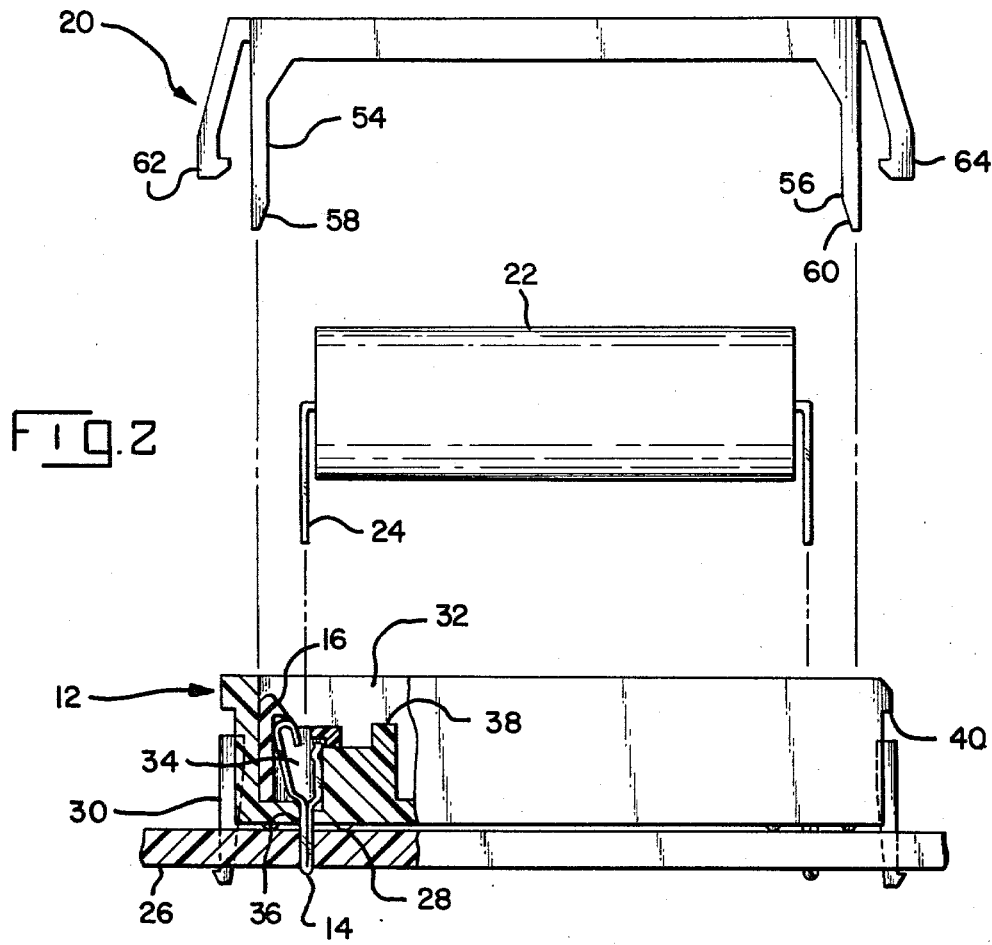
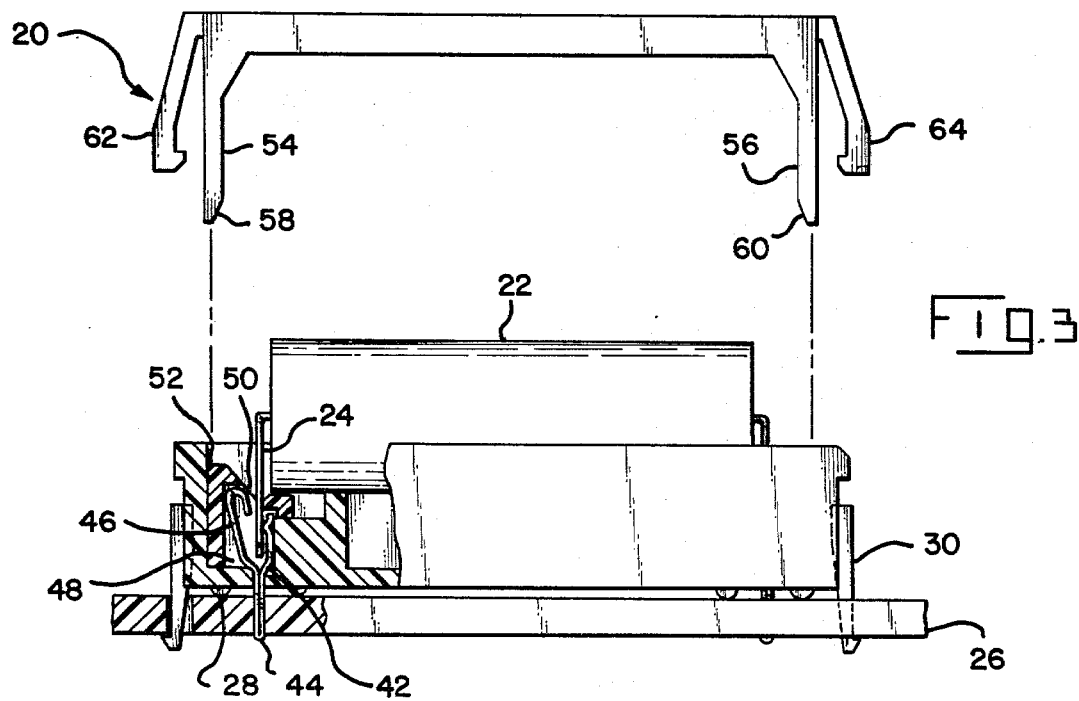

INTEGRATED CIRCUIT PACKAGE CONNECTOR

BACKGROUND OF THE INVENTION

1. The Field Of The Invention

The present invention relates to a connector assembly for mounting integrated circuit packages on printed circuit boards and in particular to a connector assembly having zero insertion force.

2. The Prior Art

A typical integrated circuit package has an integrated circuit chip enclosed within a generally rectangular insulative housing with a plurality of contact leads protruding from at least one edge of the package. Since each package usually has a large number of leads, it is preferably for the connector to be of a zero or low insertion force type. It is also preferable for the connector, once the package is engaged, to securely grasp the leads so that fibration or sudden shock will not cause even a momentary interruption in the contact engagement.

SUMMARY OF THE INVENTION

The present invention concerns a connector assembly suitable for mounting integrated circuit packages with high retention force and low insertion force. The subject assembly includes a housing adapted to be mounted against a printed circuit board or the like. A plurality of terminals are mounted in the housing, preferably in two parallel spaced apart rows. An actuation insert is mounted in the housing to act on each row of terminals. An actuating retainer or cover member is received on and in the housing to act on the insert members in such manner as to cause closure of the terminals on the leads of the integrated circuit package.

It is therefore an object of the present invention to produce an improved integrated circuit package connector which will have zero insertion force for mounting the package and high retention forces to positively secure the package in the connector.

It is another object of the present invention to produce an integrated circuit package connector having low insertion forces and high retention forces plus good thermal dissipation.

It is a still further object of the present invention to produce an improved connector assembly having a housing which can be mounted on a printed circuit board without requiring initial soldering.

It is a still further object of the present invention to produce an improved integrated circuit package connector assembly which receives the package in a housing which then receives a cover member driving inserts in the housing against the terminals to bias them in the loaded condition against the leads of the integrated circuit package thereby achieving high retention forces.

It is a still further object of the present invention to produce an integrated circuit package connector assembly which can be readily and economically manufactured.

The means for accomplishing the foregoing objects and other advantages of the present invention will become apparent to those skilled in the art from the following description taken with reference to the accompanying drawings.

BRIEF DESCRIPTION OF THE DRAWINGS

FIG. 2 is an exploded side elevation, partly in section, showing the subject connector assembly positioned to receive an integrated circuit package therein;

FIG. 3 is a side elevation, similar to FIG. 2, showing the integrated circuit package inserted into the subject connector assembly;

DETAILED DESCRIPTION OF THE PREFERRED EMBODIMENT

Figure 1:
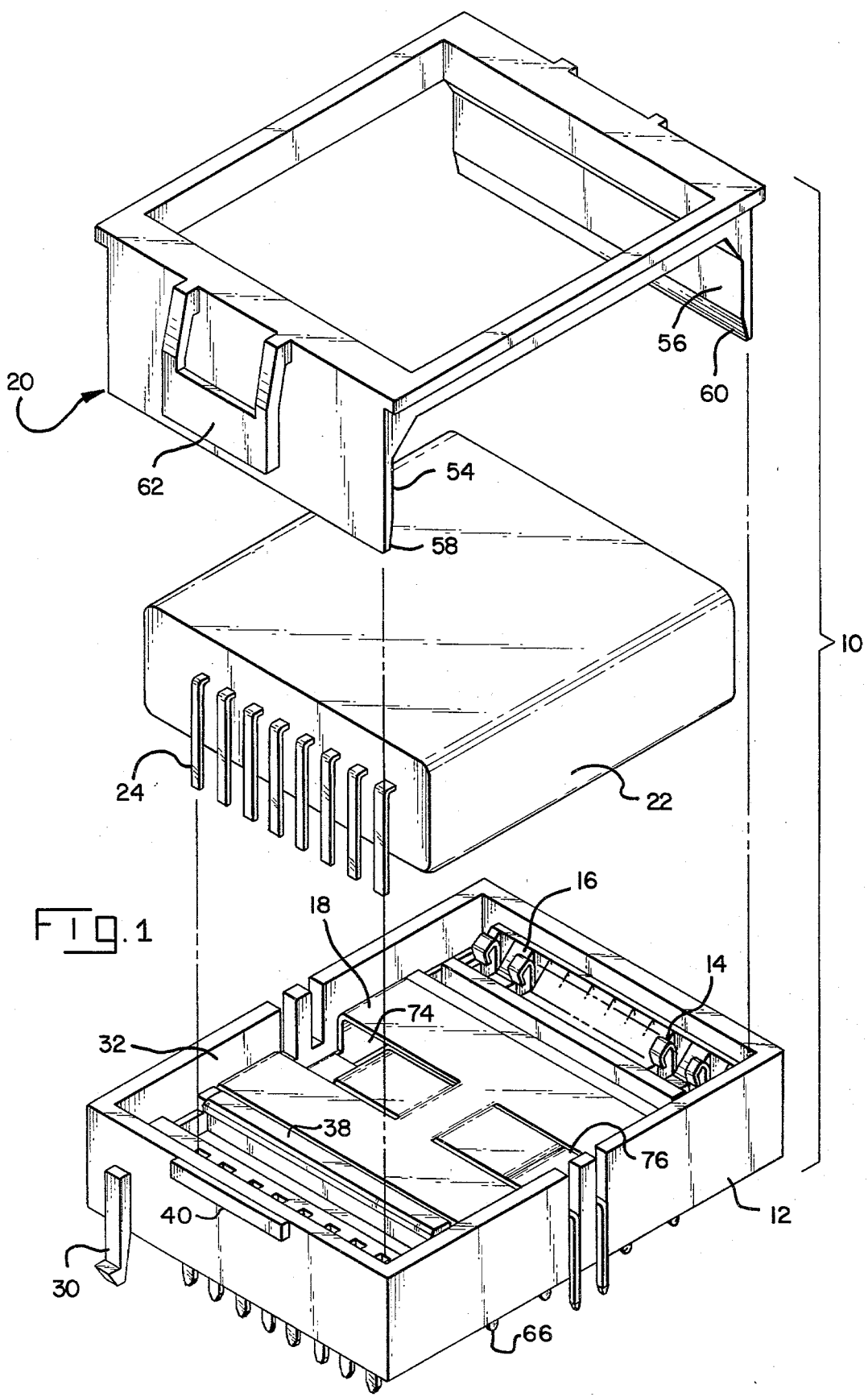
FIG. 1 is an exploded perspective view of the subject connector assembly.

The subject connector assembly 10 includes a housing 12 of rigid insulative material having a plurality of terminals 14 therein in a pair of parallel, spaced apart rows, an insert 16 for each row of terminals, at least one retainer and head dissipation means 18, and an actuating retainer cover member 20. The integrated circuit package 22, which can be a bubble memory or any other suitable device, is an encapsulated member having a plurality of leads 24 depending from at least one side thereof in parallel spaced apart condition.

The housing 12 is intended to be mounted on a printed circuit board 26 or the like (see FIGS. 2 to 5) and has for this purpose a plurality of stand-offs 28, and mounting feet 30. The housing defines a cavity 32 which includes a pair of parallel spaced channels 34 on opposite sides of the housing. Each channel has a plurality of terminal passages 36 spaced along the bottom thereof. The housing further includes profiled abutments 38 spaced inwardly of and parallel to the channels 34. Latching shoulders 40 are formed integrally on opposite outer surfaces of the housing.

A plurality of terminals 14 are provided, each mounted in a respective passage 36. Each terminal 14 is formed of a unitary piece of conductive spring material folded upon itself to have a contact arm 42, which lies against one sidewall of the channel 34, a bight 44, which extends through the passage 36 and is electrically and mechanically engaged with circuitry on the printed circuit board 26 by known means such as soldering, and a resilient backup spring arm 46 which is engaged by the insert 16.

Each insert 16 is an elongated member of rigid insulative material having a plurality of downwardly directed cavities 48, each of which receives a respective terminal 14. Each cavity has an upwardly directed opening 50 for receiving a respective lead 24 of the package 22. Each insert also has an upwardly directed cam surface 52.

The actuator and retaining cover member 20 includes a pair of spaced depending walls 54, 56 each with a cam surface 58, 60 on the free end thereof. The cover also includes latching members 62, 64 adapted to engage the shoulders 40 of the housing 12.

The retainer and heat dissipating member 18 is a stamped and formed piece of metal having downwardly depending legs 66 (see FIG. 5) adapted to be secured to the printed circuit board 26 and laterally extending arms 68 which are received on shoulders 70 of the insert members 16 to hold the insert members in the housing 12 while permitting relative movement therebetween. The member 18 also has recesses 72, 74 formed on opposite sides thereof each adapted to receive a thermistor 76, 78 therein.

The subject connector 10 is assembled by first placing the terminals 14 in the appropriate apertures 36 and holding them in place by mounting the insert members 16 over the terminals. The insert members are then held in place by placing the retainer means 18 into the housing with the arms 68 resting against the shoulders 70 of the insert members. The thus assembled housing is now ready for mounting on a printed circuit board and can be so mounted and initially held by engaging the mounting legs 30 in appropriate apertures of the circuit board. The bights 44 of the respective terminals should be engaged in appropriate apertures of the circuit board and would subsequently be secured thereto by soldering. The same soldering operation would also secure the legs 66 of the retaining means 18 and thermistors 76, 78 to the circuit board 26 thereby assuring that the insert members 16 would not be removed.

Figure 4:
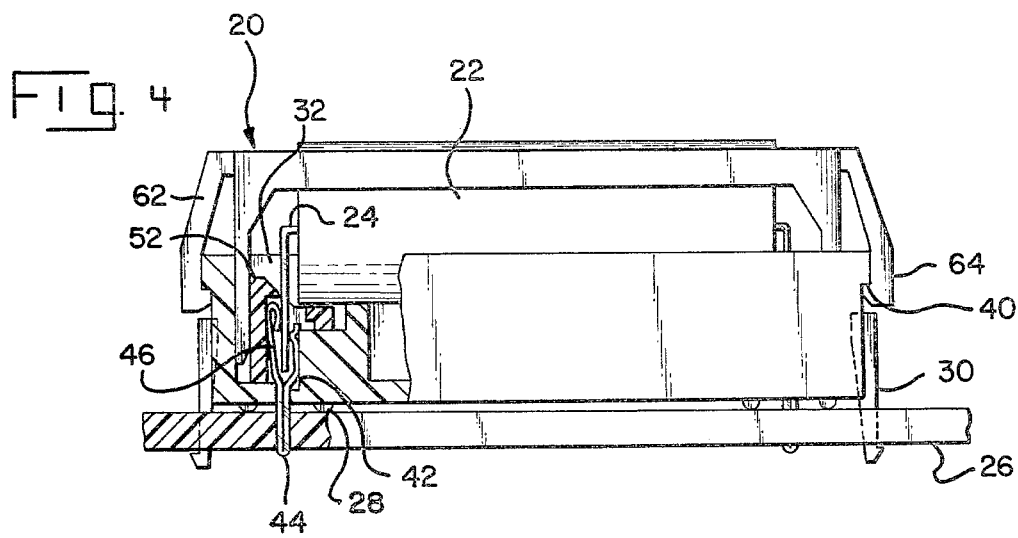
FIG. 4 is side elevation, similar to FIGS. 2 and 3, showing the integrated circuit package fully secured in the subject connector assembly.
Figure 5:
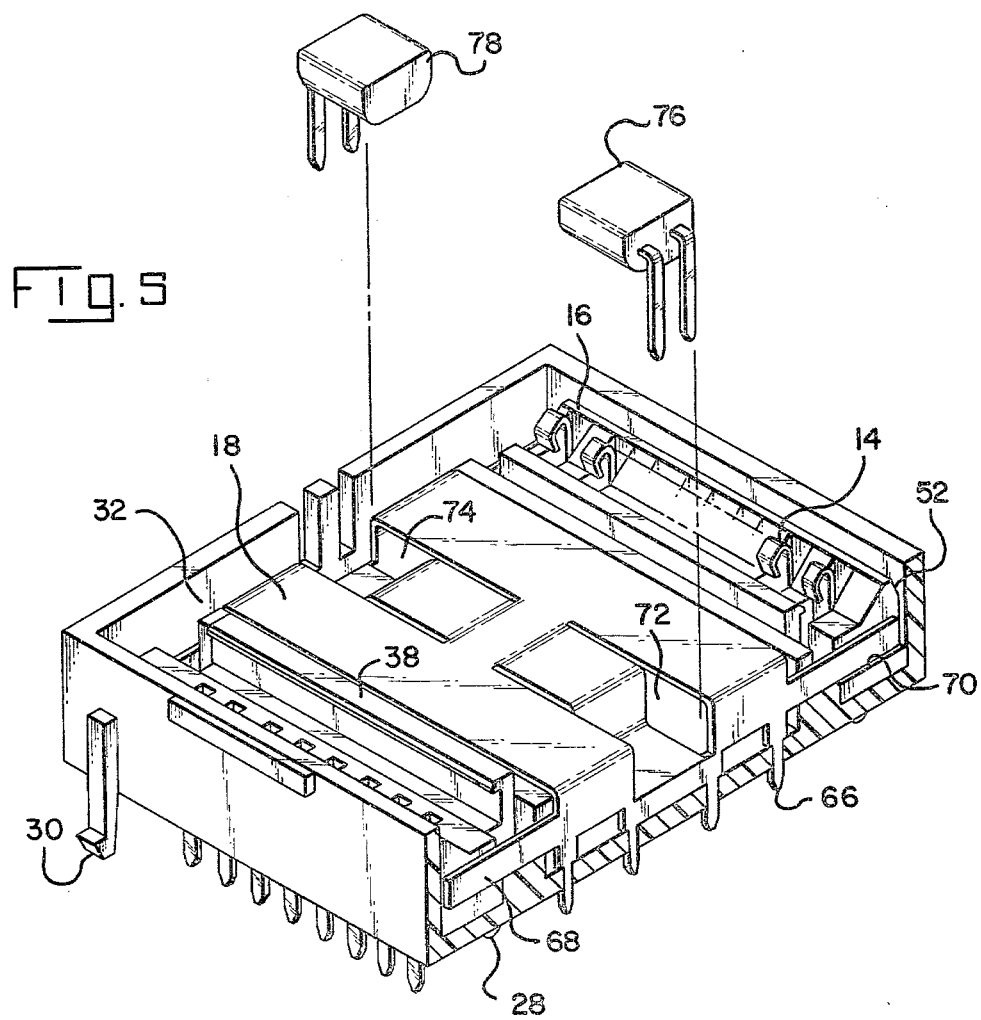
FIG. 5 is a perspective view of the housing portion of the subject connector assembly showing the heat dissipation means and thermistor mounting.

To operate the connector, a package 22 would be inserted into the cavity 32 with the leads 24 depending through the respective openings 50 to lie between the contact arms 42 and spring arms 46 of the respective terminals 14. The cover member would then be applied to the housing with the cam surfaces 58, 60 engaging the cam surfaces 52 of the insert members 16 and driving them relatively towards one another. This movement causes the spring arms 46 to close against the leads 24 of the package and to bias the leads against the contact arm 42 of the terminals. This is best seen in FIG. 4. Continued downward movement of the cover brings the latching means 62, 64 into engagement with the shoulders 40 to secure the package in place. The package is secured by both the pressure of the cover against the upper surface of the package and the tight gripping of the leads by the terminals 14.

The present invention may be subject to many modifications and changes without departing from the spirit or essential characteristics thereof. The present embodiment should therefore be considered in all respects as illustrative and not restrictive of the scope of the invention.

What is claimed is:

1. An electrical connector for integrated circuit packages having a plurality of parallel, spaced leads depending from at least one side thereof, said connector comprising:
   a housing defining a cavity with a channel formed in each of two opposite sides of said cavity, a plurality of terminal passages in spaced relation in the bottom of each said channel;
   a plurality of terminals each mounted in a respective one of said passages in parallel spaced relationship, each said terminal having a contact arm lying against one wall of said channel and a resilient spring arm normally aligned with and spaced from said contact arm;
   an insert member received in each said channel, each said insert member having a plurality of cavities each receiving a respective terminal therein, each said cavity having a lead opening providing an access to said terminal;
   hold down means for holding said insert members in said housing while allowing limited relative movement of the insert members within the housing; and
   an actuating cover member having a pair of spaced depending sidewalls each having a cam surface on a free end thereof, said cam surfaces engaging said insert members to cause relative sliding movement of said insert members with respect to said housing whereby said movement of said insert members causes said insert members to drive said spring arms of said terminals into engagement with leads of a package received in said connector.

2. A connector according to claim 1 further comprising latching means to secure said cover member to said housing.

3. A connector according to claim 1 further comprising means to secure said connector to a printed circuit board.

4. A connector according to claim 1 wherein each said terminal comprises a single member of conductive material formed on a bight to have a contact arm and a spring arm normally spaced from said contact arm, said terminal being electrically connected to circuitry of a printed circuit board by said bight.

5. A connector according to claim 1 further comprising an abutment in said housing cavity, said abutment receiving and locating packages placed in said connector.

6. A connector according to claim 1 further comprising:
   at least one recess formed in said hold down means;
   a thermistor received in each said recess whereby heat generated by said package is readily dissipated.

7. An electrical connector for integrated circuit packages having a plurality of leads depending from at least one side thereof, said connector comprising:
   a generally rectangular housing defining an upwardly directed cavity with a channel formed in each of two opposite sides of said cavity a plurality of terminal passages extending between the bottom of each channel and the bottom of said housing;
   a plurality of terminals each mounted in a respective one of said passages in parallel spaced relationship, each said terminal being formed of conductive material and having a bight defining a contact arm lying against one wall of said channel and a resilient spring arm normally spaced from said contact arm;
   an insert member received in each said channel, each said insert member having a plurality of downwardly directed cavities each receiving a respective terminal therein, a like plurality of openings in an upper surface of each said insert member, each said opening providing an access to a respective terminal located in said cavity, each said insert member having an outwardly and upwardly directed cam surface;
   hold down means for holding said insert members in said housing while allowing limited relative movement of the insert members within the housing said movement causing opening and closing of said terminals; and
   an actuating cover member having a pair of spaced depending sidewalls each having a cam surface on a free end thereof, said cam surfaces engaging respective cam surfaces of said insert members to cause relative sliding movement of said insert members with respect to said housing whereby said movement of said insert members causes said insert members to drive said spring arms of said terminals into engagement with leads of a package received in said connector, said cover member bearing against the back of said package to aid in retaining it in said connector.

8. A connector according to claim 7 further comprising latching means to detachably secure said cover member to said housing.

9. A connector according to claim 7 further comprising means to secure said connector to a printed circuit board.

10. A connector according to claim 7 further comprising an abutment in said housing cavity, said abutment receiving and locating packages placed in said connector.

* * * * *